United States Patent
Ippolito et al.

(10) Patent No.: US 7,826,045 B2
(45) Date of Patent: Nov. 2, 2010

(54) ANGULAR SPECTRUM TAILORING IN SOLID IMMERSION MICROSCOPY FOR CIRCUIT ANALYSIS

(75) Inventors: Stephen Bradley Ippolito, Croton on Hudson, NY (US); Darrell L. Miles, Wappingers Falls, NY (US); Peilin Song, Lagrangeville, NY (US); John D. Sylvestri, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 397 days.

(21) Appl. No.: 12/020,157

(22) Filed: Jan. 25, 2008

(65) Prior Publication Data

US 2009/0189630 A1    Jul. 30, 2009

(51) Int. Cl.
  *G01N 21/00* (2006.01)
(52) U.S. Cl. .................................... 356/237.1
(58) Field of Classification Search ........................ None
  See application file for complete search history.

(56) References Cited

U.S. PATENT DOCUMENTS

| | | | |
|---|---|---|---|
| 5,004,307 A | 4/1991 | Kino et al. | |
| 5,939,709 A | 8/1999 | Ghislain et al. | |
| 6,934,024 B2 | 8/2005 | Zhan et al. | |
| 7,511,280 B2 * | 3/2009 | Ward et al. | 250/423 F |
| 7,535,562 B2 * | 5/2009 | Matsui et al. | 356/237.5 |
| 2004/0076319 A1 | 4/2004 | Fauver et al. | |

OTHER PUBLICATIONS

Karrai et al.; Enhanced reflectivity contrast in confocal solid immersion lens microscopy; Applied Physics Letters, vol. 77, No. 21, Nov. 20, 2000; pp. 3459-3461.

* cited by examiner

*Primary Examiner*—Tu T Nguyen
(74) *Attorney, Agent, or Firm*—Schmeiser, Olsen & Watts; Ann Dougherty

(57) ABSTRACT

A method and structure for locating a fault in a semiconductor chip. The chip includes a substrate on a dielectric interconnect. A first electrical response image of the chip, which includes a spot representing the fault, is overlayed on a first reflection image for monochromatic light in an optical path from an optical microscope through a SIL/NAIL and into the chip. The index of refraction of the substrate exceeds that of the dielectric interconnect and is equal to that of the SIL/NAIL. A second electrical response image of the chip is overlayed on a second reflection image for the monochromatic light in an optical path in which an optical stop prevents all subcritical angular components of the monochromatic light from being incident on the SIL/NAIL. If the second electrical response image includes or does not include the spot, then the fault is in the substrate or the dielectric interconnect, respectively.

14 Claims, 7 Drawing Sheets

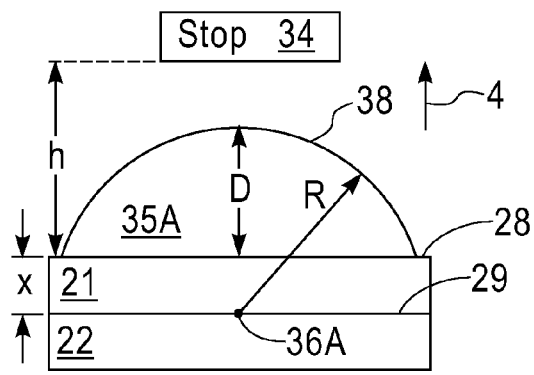
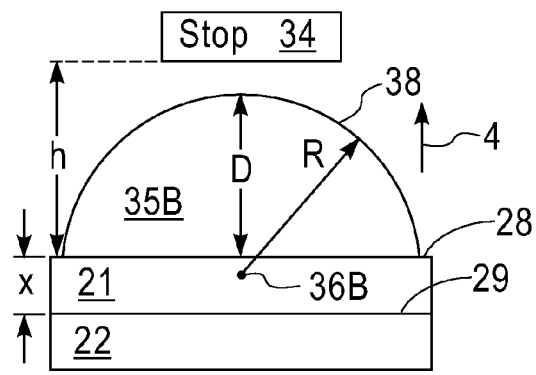
FIG. 2A  FIG. 2B
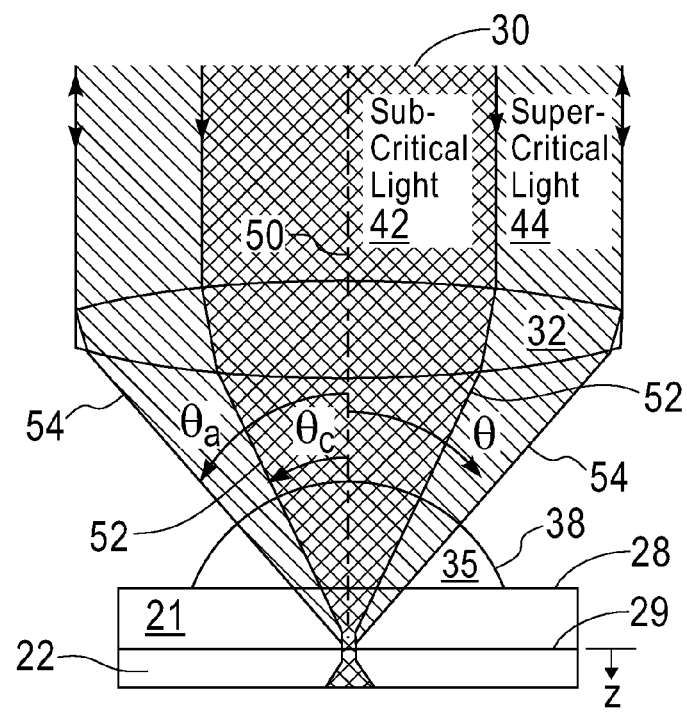
FIG. 3

ANGULAR SPECTRUM TAILORING IN SOLID IMMERSION MICROSCOPY FOR CIRCUIT ANALYSIS

FIELD OF THE INVENTION

The present invention relates to a method and associated structure for locating a fault in a semiconductor chip.

BACKGROUND OF THE INVENTION

Optical microscopes are used in conjunction with electrical testers to diagnose process and design faults in integrated circuits. However, diffraction limits optical microscopy through the substrate of an integrated circuit to spatial resolutions that are insufficient to resolve the smallest features in the integrated circuit. Furthermore, contribution to the optical microscopy images by multiple transistor and interconnect layers in the integrated circuit prevents accurate longitudinal fault localization and accurate lateral registration to the circuit.

Thus, there is a need for improved lateral and longitudinal spatial resolution in optical diagnostics of process and design faults in integrated circuits in order to increase the information gathered by the optical diagnostics.

SUMMARY OF THE INVENTION

The present invention provides a structure, comprising:

a semiconductor chip comprising a substrate and a dielectric interconnect in direct mechanical contact with each other at an interface, wherein the substrate comprises semiconductor circuit elements, and wherein an index of refraction of the dielectric interconnect ($n_{die}$) is less than an index of refraction of the substrate ($n_{sub}$) with respect to monochromatic light characterized by a free-space wavelength $\lambda_0$;

a SIL/NAIL denoting a solid immersion lens (SIL) or a numerical aperture increasing lens (NAIL), wherein an index of refraction of the SIL/NAIL with respect to the monochromatic light is about equal to the index of refraction of the substrate ($n_{sub}$), and wherein the SIL/NAIL is parallel to and in direct mechanical contact with an external surface of the substrate;

an optical microscope having an objective lens and configured to direct the monochromatic light toward the SIL/NAIL; and an optical stop, wherein either the objective lens is disposed between the stop and the SIL/NAIL or the stop is disposed between the objective lens and the SIL/NAIL, wherein the stop is opaque to the monochromatic light, wherein the stop has a sufficiently large size to prevent all subcritical angular components of the monochromatic light from being incident on the SIL/NAIL upon being directed toward the SIL/NAIL from the optical microscope, and wherein the subcritical angular components are subcritical with respect to a critical angle for total internal reflection at the interface.

The present invention provides a method for locating a fault in a semiconductor chip, said method comprising:

providing the semiconductor chip, wherein the semiconductor chip comprises a substrate and a dielectric interconnect in direct mechanical with each other at an interface, wherein the substrate comprises semiconductor circuit elements, and wherein an index of refraction of the dielectric interconnect ($n_{die}$) is less than an index of refraction of the substrate ($n_{sub}$) with respect to monochromatic light characterized by a free-space wavelength $\lambda_0$;

providing a SIL/NAIL denoting a solid immersion lens (SIL) or a numerical aperture increasing lens (NAIL), wherein an index of refraction of the SIL/NAIL with respect to the monochromatic light is about equal to the index of refraction of the substrate ($n_{sub}$);

determining a lateral location of the fault in the semiconductor chip in a lateral direction parallel to the interface;

positioning the SIL/NAIL on the chip such that a planar surface of the SIL/NAIL is parallel to and in direct mechanical contact with an external surface of the substrate;

directing the monochromatic light in a first optical path from an optical microscope through the SIL/NAIL and then into the substrate at angles ($\theta$) equal to and greater than zero degrees with respect to a longitudinal direction that is perpendicular to the lateral direction and then into the dielectric interconnect by refraction at the interface, wherein the first optical path comprises the determined lateral location of the fault, and wherein the optical microscope comprises an objective lens;

obtaining a first reflection image and a first electrical response image of a portion of the chip with respect to the monochromatic light in the first optical path and overlaying the first electrical response image on the first reflection image to form a first composite image, wherein a spot on the overlayed first electrical response image identifies the fault;

directing the monochromatic light in a second optical path from the optical microscope through the SIL/NAIL and then into the substrate, wherein an optical stop in the second optical path is opaque to the monochromatic light and comprises a sufficiently large size to prevent all subcritical angular components of the monochromatic light from being incident on the SIL/NAIL, and wherein the second optical path comprises the determined lateral location of the fault;

obtaining a second reflection image and a second electrical response image of the portion of the chip with respect to the monochromatic light in the second optical path and overlaying the second electrical response image on the second reflection image to form a second composite image;

ascertaining whether the overlayed second electrical response image comprises the spot;

if said ascertaining ascertains that the overlayed second electrical response image comprises the spot, then recording that the fault is in the substrate;

if said ascertaining ascertains that the overlayed second electrical response image does not comprise the spot, then recording that the fault is in the dielectric intercorrect.

The present invention advantageously provides improved lateral and longitudinal spatial resolution in optical diagnostics of process and design faults in integrated circuits, which increases the information gathered by the optical diagnostics.

BRIEF DESCRIPTION OF THE DRAWINGS

FIG. 2A depicts a central SIL/NAIL representing the SIL/NAIL of FIG. 1, in accordance with embodiments of the present invention.

FIG. 2B depicts an aplanatic SIL/NAIL representing the SIL/NAIL of FIG. 1, in accordance with embodiments of the present invention.

FIG. 3 depicts paths of optical rays from the optical microscope of FIG. 1 traversing the semiconductor chip with the optical stop not present, in accordance with embodiments of the present invention.

DETAILED DESCRIPTION OF THE INVENTION

The present invention uses an optical microscope in conjunction with electrical testing to diagnose process and design faults in a semiconductor chip. In an embodiment in which the optical microscope is a confocal laser scanning microscope, optical excitation by laser stimulation is used in conjunction with the confocal laser scanning microscope to simultaneously acquire confocal reflection and electrical response images. The electrical response of a circuit in the chip occurs primarily through localized carrier generation and heating. The confocal reflection image used in conjunction with an optical stop facilitates lateral registration of the electrical response image to the circuit layout. The optical stop is also used in conjunction with the optical microscope and electrical testing to longitudinally localize faults in the integrated circuit.

Figure 1:
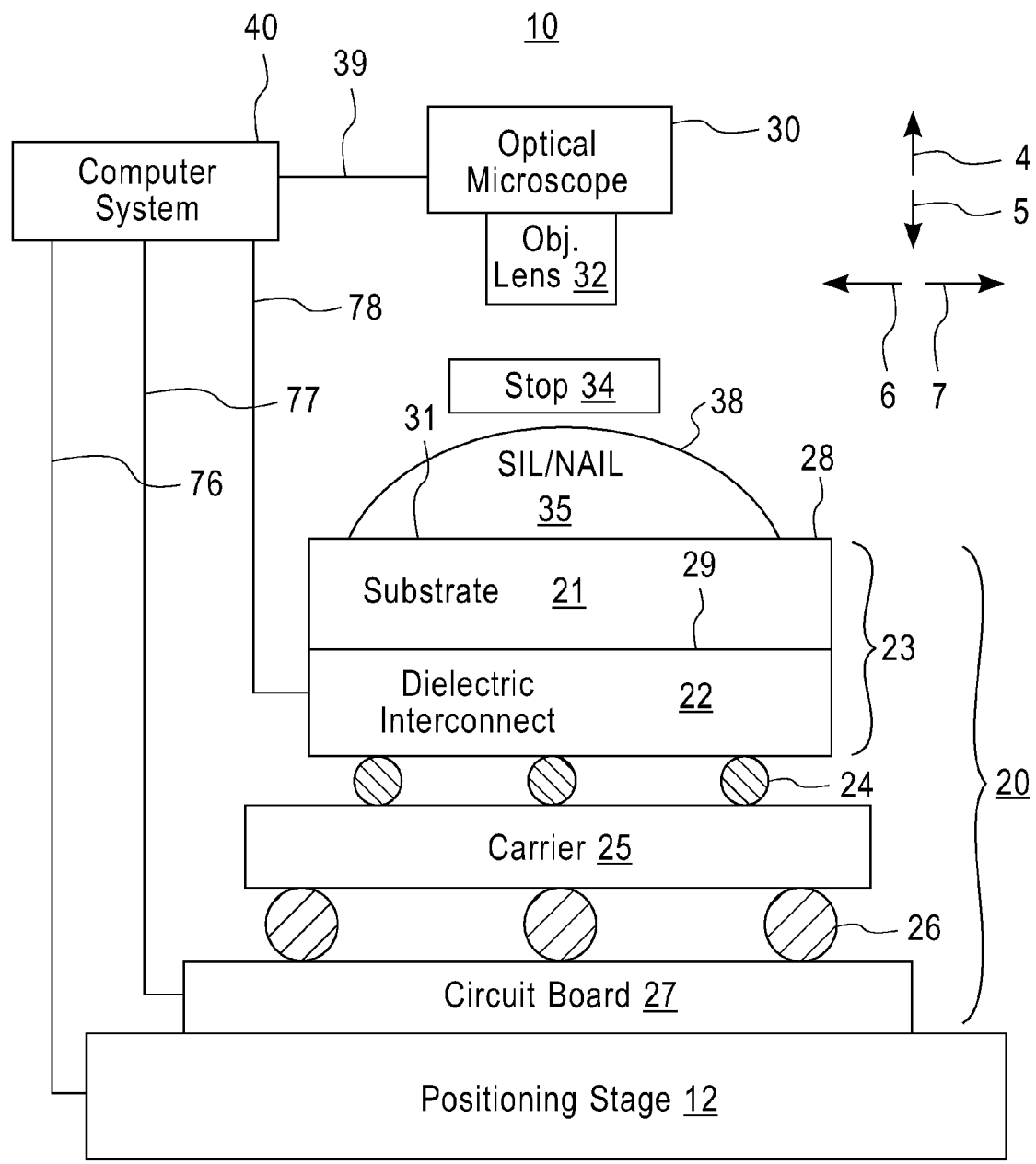
FIG. 1 depicts a system comprising an optical microscope with a SIL/NAIL and an optical stop for locating a fault in a semiconductor chip, in accordance with embodiments of the present invention.

FIG. 1 depicts a system 10 for determining the spatial location of a fault in a semiconductor chip, in accordance with embodiments of the present invention. The system 10 is a structure comprising an optical microscope 30 having an objective lens 32, a removable optical stop 34, a computer system 40, a positioning stage 12, and a SIL/NAIL 35 which denotes a solid immersion lens (SIL) or a numerical aperture increasing lens (NAIL). The SIL/NAIL 35 may comprise materials such as Si, GaAs, GaP, or Ge. Information regarding SIL/NAIL microscopy may be found in U.S. Pat. No. 5,004,307 to Kino et al. (issued Apr. 2, 1991), U.S. Pat. No. 5,208,648 to Batchelder et al. (issued May 4, 1993), and U.S. Pat. No. 6,687,058 to Ippolito et al. (issued Feb. 3, 2004), all of which are incorporated herein by reference in their entirety.

The positioning stage 12 is configured to mechanically support an electronic structure 20. The electronic structure 20 comprises a semiconductor chip 23 conductively coupled by interconnects 24 to a chip carrier 25 which is conductively coupled by interconnects 26 to a circuit board 27. The chip carrier 25 may be a ceramic or organic chip carrier. The interconnects 24 may be, inter alia, controlled collapse chip connection (C4) solder balls. The interconnects 26 may be, inter alia, ball grid array (BGA) solder balls. The circuit board 27 is directly supported by the positioning stage 12.

In one embodiment, the chip 23 is not connected to the chip carrier 25 and is directly supported by the positioning stage 12, inasmuch as the chip carrier 25 and circuit board 27 are not present in the system 10 in this embodiment.

The positioning stage 12 is electrically coupled to the computer system 40 by the electrical path 76 and is thus under control of the computer system 40 for being moved in a longitudinal direction 4 and/or 5, and for being moved in a lateral direction 6 and/or 7.

The semiconductor chip 23 comprises a substrate 21 (called front-end-of-line (FEOL)) and a dielectric interconnect 22 (called back-end-of-line (BEOL)). The substrate 21 and the dielectric interconnect 22 are in direct mechanical contact with each other at an interface 29.

The substrate 21 comprises semiconductor circuit elements (e.g., sources, drains, gates, etc.) containing semiconductor material such as silicon and may also comprise bulk semiconductor material (e.g., silicon), silicon-on-insulator (SOI), etc. Semiconductor material (e.g., silicon) is distributed longitudinally in the substrate 21 from an external surface 28 of the substrate 21 to the interface 29, with possible one or more discontinuities or gaps in the longitudinal distribution of semiconductor material between the external surface 28 and the interface 29.

The dielectric interconnect 22 comprises an interconnect layer comprising metal layers (e.g., copper interconnect lines and contacts) embedded in surrounding dielectric material (e.g., silicon dioxide, silicon nitride). Metallic material of the metal layers in the dielectric interconnect 22 serves to electrically couple semiconductor circuit elements of the substrate 21 to structure and/or devices external to the chip 23. The dielectric interconnect 22 comprises primarily dielectric material and metal.

The index of refraction of the substrate 21 (denoted as $n_{sub}$) exceeds the index of refraction of the dielectric interconnect 22 (denoted as $n_{die}$). In one embodiment in which the substrate 21 comprises silicon, $n_{sub}$ is about 3.5. In one embodiment in which the dielectric interconnect 22 comprises silicon dioxide and/or silicon nitride, $n_{die}$ is in a range from about 1 to about 2.

The SIL/NAIL 35 has the geometry of a truncated sphere with an outer spherical surface 38 and a planar surface 31. The planar surface 31 of the SIL/NAIL 35 is parallel to and is directly disposed on, and in direct mechanical contact with, the external surface 28 of the substrate 21 of the chip 23. The index of refraction of the SIL/NAIL 35 is about equal to the index of refraction of the substrate 21 ($n_{sub}$).

The optical microscope 30 comprises a source of monochromatic light characterized by a free-space wavelength $\lambda_0$. The free-space wavenumber $k_0$ corresponding to the wavelength $\lambda_0$ for the monochromatic light is equal to $2\pi/\lambda_0$. The term "light" encompasses electromagnetic radiation of any wavelength.

The optical microscope 30 is electrically coupled to the computer system 40 by the electrical path 39 and may be operated under control of the computer system 40. For example, the computer system 40 may be used to control the optical power and wavelength during operation of the optical microscope 30. The optical microscope 30 is configured to optically probe the chip 23 for faults in either the substrate 21 or the dielectric interconnect 22 as will be described infra. Optical feedback data to the optical microscope 30 derived from optically probing the chip 23 may be transmitted from the optical microscope 30 to the computer system 40. The optical feedback data may thus be analyzed by the computer system 40, and the analyzed data may be displayed graphically or pictorially on a display of the computer system 40. In one embodiment, the optical microscope 30 is a confocal laser scanning microscope. Alternatively, other types of optical microscopes (e.g., a widefield imaging microscope) may be used for the optical microscope 30.

The removable optical stop 34 may have, inter alia, a circular shape and is disposed between the objective lens 32 and the SIL/NAIL 35. Alternatively, the stop 34 may be within the optical microscope 30 such that the objective lens 32 is disposed between the stop 34 and the SIL/NAIL 35 (see FIG. 5). The stop 34 and the SIL/NAIL 35 are used in conjunction with optically probing the chip 23 for faults as will be described infra. The stop 34 is optically opaque to the wavelength of monochromatic light emitted from the optical microscope 30.

The optical probing of the chip 23 by the optical microscope uses a monochromatic optical beam at a wavelength that heats the material of the chip 23 in a manner that changes an electrical response of the chip 23. The electrical response, which occurs differently at faults in the chip 23 than at non-fault locations, may be transmitted to the circuit board 27 and subsequently to the computer system 40 via electrical path 77. In one embodiment, the electrical responses may be transmitted from circuitry in the chip 23 to the computer system 40 via electrical path 78.

FIG. 2A depicts a central SIL/NAIL 35A representing the SIL/NAIL 35 of FIG. 1, in accordance with embodiments of the present invention. The central SIL/NAIL 35A is characterized by the center of curvature 36A of the central SIL/NAIL 35A being at the interface 29 between the substrate 21 and the dielectric interconnect 22 of the chip 23. The radius of curvature (R) of the central SIL/NAIL 35A is equal to X+D, wherein X is the thickness of the substrate 21 in the direction 4, and wherein D is the maximum thickness of the central SIL/NAIL 35A in the direction 4. The central SIL/NAIL 35A has a concentric spherical pupil surface at a radius of $n_{sub}R/(n_{sub}-1)$ with respect to the center of curvature 36A. The stop 34 is at a height (h) in the direction 4 above the top surface 29 of the substrate 21. In one embodiment, the optical stop 34 is about touching the outer surface of the central SIL/NAIL 35A and is separated from the central SIL/NAIL 35A only to the extent of enabling the optical stop 34 to be easily removed.

FIG. 2B depicts an aplanatic SIL/NAIL 35B representing the SIL/NAIL 35 of FIG. 1, in accordance with embodiments of the present invention. The aplanatic SIL/NAIL 35B is characterized by the center of curvature 36B of the aplanatic SIL/NAIL 35B being within the substrate 21 of the chip 23 between the external surface 28 and the interface 29. The radius of curvature (R) of the aplanatic SIL/NAIL 35B is equal to $(n_{sub}/(n_{sub}+1))*(X+D)$, wherein X is the thickness of the substrate 21 in the direction 4, and wherein D is the maximum thickness of the aplanatic SIL/NAIL 35B in the direction 4. The aplanatic SIL/NAIL 36B has a concentric spherical pupil surface at a radius of $n_{sub}R/(n_{sub}-1)$ with respect to the center of curvature 3 6B which is the same radius as with the central SIL/NAIL 35A of FIG. 2A within the paraxial limit as, but at higher angles, parallel rays in the objects space intersect at radii between R and $n_{sub}R/(n_{sub}-1)$, if at all. The stop 34 is at a height (h) in the direction 4 above the top surface 29 of the substrate 21. In one embodiment, the optical stop 34 is nearly touching the outer surface of the aplanatic SIL/NAIL 35B and is separated from the aplanatic SIL/NAIL 35B only to the extent of enabling the optical stop 34 to be easily removed.

The incident optical field in the substrate 21 can be represented by an angular spectrum of plane waves with varying lateral wavenumber, $k_{r\text{-}sub}$. Light directly coupled into a planar substrate only contains components with $k_{r\text{-}sub}$ less than the free space wavenumber, $k_0$. However, light coupled through the SIL/NAIL 35 can also contain components with $k_{r\text{-}sub}$ between $k_0$ and $n_{sub}k_0$. Transmission at the spherical surface 38 of the SIL/NAIL 35, across the gap between the SIL/NAIL 35 and the substrate 21, and across buried oxide in silicon-on-insulator (SOI) circuits, strongly modulates the angular spectrum at transistors in the substrate 21.

In geometrical optics of imaging systems at a pupil surface, the position of intersecting rays is a function of the angle of the rays in the object space and is independent of the position of the rays in the object space. Spatial light modulation at a pupil surface allows angular spectrum control throughout the full field of view in the object space. However, spatial light modulation at any non-image surface intersecting the optical path allows angular spectrum tailoring, although with a restricted field of view.

Interconnect metal in the dielectric interconnect 22 fabricated onto the transistors in the substrate 21 is surrounded by transparent interconnect dielectric, with a refractive index $n_{die}$ between 1 and 2. The interface 29 between the substrate 21 and the dielectric interconnect 22 acts as a barrier to light with respect to a critical angle ($\theta_c$) for total internal reflection, wherein $\theta_c$ is relative to the optic axis 50 (see FIG. 3) of the optical microscope 30. The critical angle $\theta_c$ is equal to $\sin^{-1}(n_{die}/n_{sub})$. For $n_{sub}$=3.5 and $n_{die}$=1, the critical angle $\theta_c$ is about 17 degrees. For $n_{sub}$=3.5 and $n_{die}$=2, the critical angle $\theta_c$ is about 35 degrees.

FIG. 3 depicts paths of optical rays from the optical microscope 10 of FIG. 1 traversing the semiconductor chip 23 with the optical stop 34 not present, in accordance with embodiments of the present invention. The optical ray 52 is at the critical angle $\theta_c$ and defines the region 42 of subcritical light between the optic axis 50 of the microscope 30 and the optical ray 52. In FIG. 3, the subcritical light in region 42 penetrates the total thickness of both the substrate 21 and the dielectric interconnect 22. The optical ray 54 defines the angular semi-aperture $\theta_a$ of the microscope 30. The region 44 comprises supercritical light existing between the optical ray 52 and the optical ray 54. In the region 44, the optical field penetrates into the dielectric interconnect 22 according to an evanescent decay exp(-Z/L), wherein the distance Z is measured from the interface 29 as shown. As shown in Equation (1) infra, the decay length L is a function of the angle θ that characterizes the supercritical ray in the substrate 21 with respect to the optic axis 50.

$$L=1/\{k_0*\text{sqrt}((n_{sub}*\sin\theta)^2-(n_{die})^2)\} \qquad (1)$$

wherein "sqrt" means "square root", and wherein $k_0$ is the free space wave number of the radiation from the optical microscope 30 (i.e., $k_0$=2π/$\lambda_0$ and $\lambda_0$ is the free space wavelength of the radiation). As seen from Equation (1), L is infinite at θ=$\theta_c$, and L decreases monotonically as θ increases from $\theta_c$ to $\theta_a$.

Figure 4:
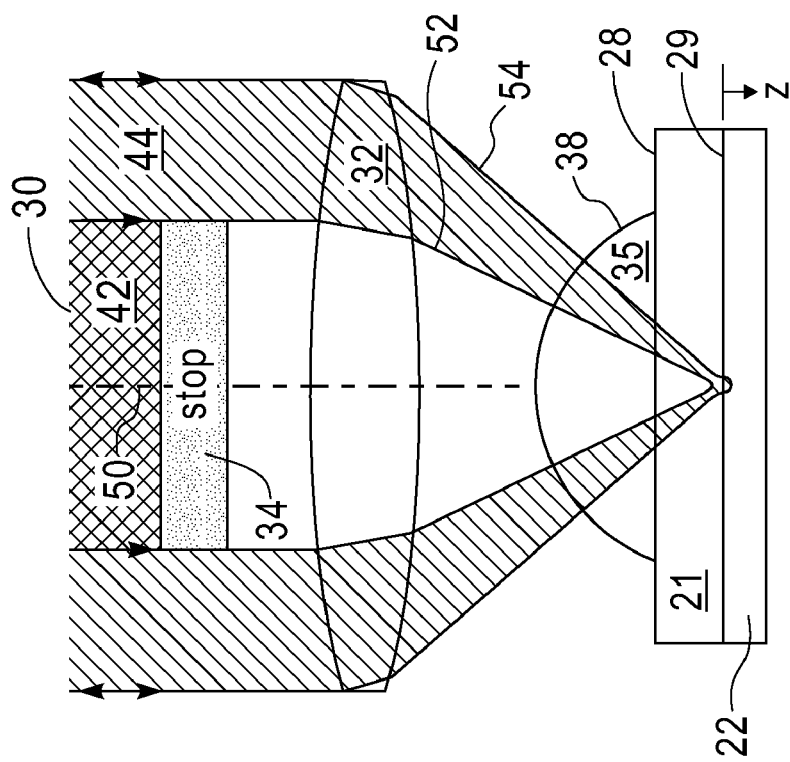
FIG. 4 depicts paths of optical rays from the optical microscope of FIG. 1 traversing the semiconductor chip with the optical stop present, in accordance with embodiments of the present invention.

FIG. 4 depicts paths of optical rays from the optical microscope 10 of FIG. I traversing the semiconductor chip 23 with the optical stop 34 present, in accordance with embodiments of the present invention. FIG. 4 differs from FIG. 3 only in the presence of the optical stop 34 in FIG. 4 but not in FIG. 3.

The stop 34 in FIG. 4 has a diameter $d_c$ (called the "critical diameter") extending through the critical angle $\theta_c$, resulting in the block 34 blocking the subcritical light but not blocking the supercritical light from reaching the chip 23. Generally the diameter d of the stop 34 in FIG. 4 is not less than the critical diameter $d_c$ and may be determined for a maximum decay length, L, in accordance with Equations (2)-(3) infra, for the central SIL/NAIL 35A of FIG. 2A and the aplanatic SIL/NAIL 35B of FIG. 2B, as a function of θ for supercritical light characterized by θ>$θ_c$.

$$d=2*h*\tan(\arcsin(\sqrt{(n_{die})^2+(L*k_0)^{-2}})/n_{sub})); \text{central SIL/NAIL} \quad (2)$$

$$d=2*h*\tan(\arcsin(\sqrt{(n_{die})^2+(L*k_0)^{-2}}/(n_{sub})^2)); \text{aplanatic SIL/NAIL} \quad (3)$$

wherein "sqrt" means "square root". Furthermore, the lateral wavenumber $k_{r-sub}$ satisfies Equation (4) infra:

$$k_{r-sub}=n_{sub}*k_0*\sin\theta \quad (4)$$

At the critical angle (θ=$θ_c$), d=$d_c$ and $k_{r-sub}=n_{die}k_0$, and at a supercritical angle (θ>$θ_c$), d>$d_c$ and $k_{r-sub}>n_{die}k_0$ in association with evanescent decay of the supercritical light into the dielectric interconnect 22. Thus, from Equations (2)-(3) for the case of θ=$θ_c$, where L is infinite, $$d_c=2*h*\tan(\arcsin(n_{die}/n_{sub})); \text{central SIL/NAIL} \quad (5)$$

$$d_c=2*h*\tan(\arcsin(n_{die}/(n_{sub})^2)); \text{aplanatic SIL/NAIL} \quad (6)$$

Figure 5:
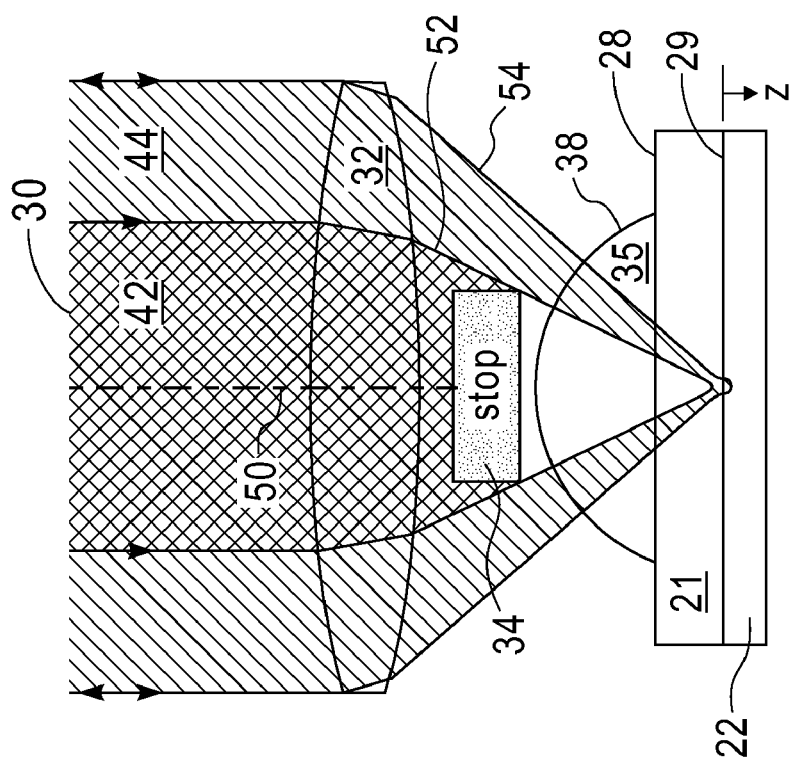
FIG. 5 depicts paths of optical rays from the optical microscope of FIG. 1 traversing the semiconductor chip with the optical stop repositioned, in accordance with embodiments of the present invention.

FIG. 5 depicts paths of optical rays from the optical microscope 10 of FIG. 1 traversing the semiconductor chip 23 with the optical stop 34 repositioned, in accordance with embodiments of the present invention. FIG. 5 differs from FIG. 3 only in the presence of the optical stop 34 in FIG. 5 but not in FIG. 3. FIG. 5 differs from FIG. 4 only in the position of the optical stop 34.

The optical stop 34 in FIG. 5 is repositioned such that the objective lens 32 is disposed between the stop 34 and the SIL/NAIL 35. The diameter d of the stop 34 may be determined (manually or via computer simulation) by propagating and tracing a ray at an angle θ≧$θ_c$ from the object space (i.e., from circuits of the substrate 21) out through the SIL/NAIL 35 and through the optical microscope 30. The diameter d is determined to be equal to 2r, wherein r is the radial distance of the traced ray at angle θ from the optic axis 50 in a plane at the longitudinal level at which the stop 34 is positioned in the microscope 30.

Figure 6:
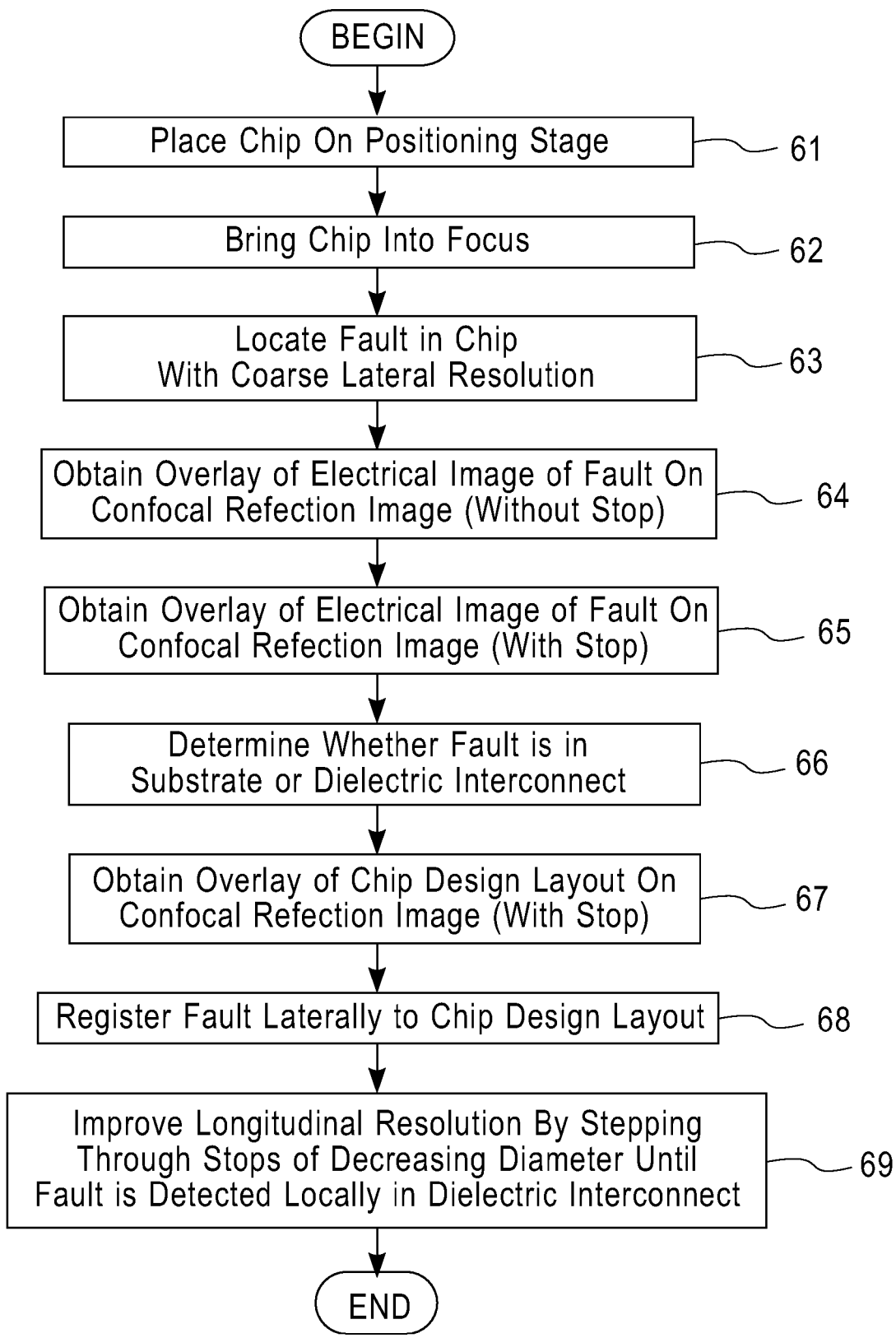
FIG. 6 is a flow chart describing a method of locating a fault in the semiconductor chip of FIG. 1, in accordance with embodiments of the present invention.

FIG. 6 is a flow chart depicting a method of locating a fault in the semiconductor chip 23 of FIG. 1, in accordance with embodiments of the present invention. The method depicted in FIG. 6 comprises steps 61-69.

The method of FIG. 6 will be illustrated for an embodiment in which the optical microscope 30 is a confocal laser scanning microscope from Credence Systems with a 2.45 numerical aperture central SIL. Mechanical access to the pupil surface was not available, so a circular point stop with a fixed radius of 1.17 mm was centered in the back focal plane of the microscope objective lens and translated longitudinally to adjust the wavenumber cutoff. Confocal reflection images of memory array cells in an IBM POWER6 microprocessor fabricated by a 65 nm SOI process will be depicted and described infra in conjunction with FIGS. 7-9. The fault shown in FIGS. 7-8 responds to optical excitation at a laser wavelength of 1064 nm, with a change in signal path delay.

In the method of FIG. 6, the chip 23 may exist as coupled to the chip carrier 25 and circuit board 27 as shown in FIG. 1 or alternatively may exist be on the positioning stage 12 with the chip carrier 25 and circuit board 27 not present in the system 10 of FIG. 1. Also in the method of FIG. 6, the stop 34 may be disposed between the objective lens 32 and the SIL/NAIL 35 as shown in FIGS. 1 and 4, or alternatively may be within the optical microscope 30 such that the objective lens 32 is disposed between the stop 34 and the SIL/NAIL 35 as shown in FIG. 5 as is the case in FIG. 8. Initially beginning at step 61, the SIL/NAIL 35 and the stop 34 are not used, and a low-end objective lens is used for the objective lens 32.

Step 61 places the chip 23 on the positioning stage 12 with or without the chip carrier 25 and circuit board 27 as discussed supra. The chip 23 is placed on the positioning stage 12 such that the planar surface 31 of the SIL/NAIL 35 is parallel to and in direct mechanical contact with the external surface 28 of the substrate 21.

Step 62 brings the chip 23 into focus for a fixed position of the optical microscope 30, by adjusting the lateral and longitudinal position of the positioning stage 12 under control of the computer system 40 via electrical path 76. The focus of the chip 23 may be monitored on a confocal reflection image of the chip 23 displayed on a computer screen or other display of the computer system 40.

Step 63 locates a fault in the chip 23 with coarse lateral resolution by applying a voltage to the chip 23 and monitoring the chip 23 for abnormal electrical output (e.g., abnormal electrical delay, current leakage indication, abnormal indication of a pass/fail state, etc.) as electrical/optical parameters (e.g., laser power, applied voltage to chip, wavelength, etc.) are varied. An electrical output that is outside of an expected range of output value is considered to indicate the presence of a fault. The electrical output may be received by the computer system 40 from the circuit board 27 via electrical path 77 and/or from the chip 23 via electrical path 78.

After the fault is initially located as described supra using a low-end objective lens, the objective lens is changed successively to objective lenses providing increasingly higher optical resolution with successively smaller fields of view until higher lateral resolution of the fault cannot be obtained through change of the objective lens. At this point the SIL/NAIL 35 has not yet been used and there is no indication of where the fault is longitudinally.

Figure 7:
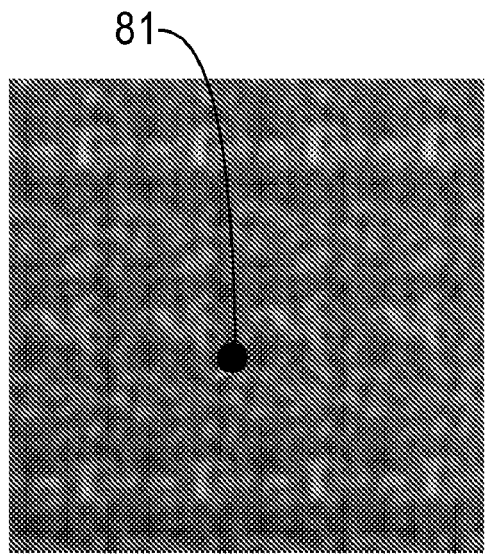
FIG. 7 is an image of an overlay of an electrical image of a fault on a confocal reflection image obtained with an optical stop not having been used, in accordance with embodiments of the present invention.

Step 64 uses the SIL/NAIL 35 in conjunction with the highest-resolution objective lens 32 in step 63 for monitoring electrical output to improve the lateral resolution of the fault. The result of step 64 is a first composite image, namely an overlay of an electrical image of the fault on the confocal reflection image obtained with the stop 34 not having been used, as shown in the image of FIG. 7 in accordance with embodiments of the present invention. The spot 81 denotes the electrical response associated with the fault. Due to optical contributions from dielectric/metal layers in the dielectric interconnect 22, lateral registration to the circuit layout in the substrate 21 cannot be accomplished with good accuracy using the image of FIG. 7 for which the stop 24 was not used.

Figure 8:
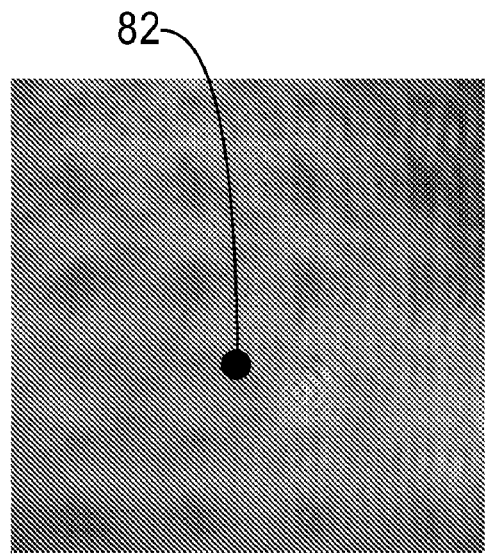
FIG. 8 is an image of an overlay of an electrical image of a fault on a confocal reflection image obtained with an optical stop having been used, in accordance with embodiments of the present invention.

Step 65 uses both the SIL/NAIL 35 and the stop 34 in conjunction with the highest-resolution objective lens in step 63 for monitoring of electrical output to improve the lateral resolution of the fault. The diameter d of the stop 34 satisfies d≧$d_c$, so that the result of step 65 is a second composite image, namely an overlay of an electrical image of the fault on the confocal reflection image obtained with the stop 34 having been used, as shown in the image of FIG. 8 in accordance with embodiments of the present invention. In one embodiment, the diameter d of the stop 34 is equal to $d_c$. In one embodiment, the diameter d of the stop 34 is in the range of $d_c$<d≦$d_a$, wherein $d_a$ is the semi-aperature diameter, wherein $d_a$ is the value of d at θ=$θ_a$ from Equations (2)-(3) such that $θ_a$ is the semi-aperture pertaining to the microscope 30.

The spot 82 denotes the electrical response associated with the fault inasmuch as the fault is in the substrate 21. The spot 82 would have been absent from FIG. 8 if the fault were in the dielectric interconnect 22, because optical contributions from dielectric/metal layers in the dielectric interconnect 22 are essentially non-existent due to the suppression of subcritical light by the stop 34. Consequently, the confocal reflection image of FIG. 8 is much cleaner and more useful for laterally registering the electrical response of the fault to the circuit layout in the substrate 21 as discussed infra in conjunction with step 67.

Step 66 determines whether the fault is in the substrate 21 or is in the dielectric interconnect 22. The presence of the spot 82 in FIG. 8 indicates that the fault is located longitudinally in the substrate 21, be cause even though the subcritical light is suppressed in step 65, the supercritical light interacts with the fault in the substrate 21 to generate substantially or essentially the same electrical response as in FIG. 7. However, an absence in FIG. 8 of the spot 82 indicates that the fault is located longitudinally in the dielectric interconnect 22, because the almost total absence of optical activity in the dielectric interconnect 22 removes a detectable electrical response due to the fault. Although there may be some relatively small optical activity the dielectric interconnect 22 due to evanescent decay rather than total cutoff of light, the intensity of any electrical response in FIG. 8 due to the fault would be negligibly small compared with the intensity of the electrical response associated with the spot 81 in FIG. 7, so that a striking contrast in the electrical responses in FIGS. 7 and 8 in which the spot 82 is essentially not present in FIG. 8 would lead to the conclusion that the fault is in the dielectric interconnect 22.

The preceding result of step 66 of whether the fault has been determined to be located in the substrate 21 or has been determined to be located in the dielectric interconnect 22 may be recorded any known output form such as, inter alia, printed output from the computer system 40, stored output in a memory device of the computer system 40, display output on a display device of the computer system 40, etc.

Figure 9:
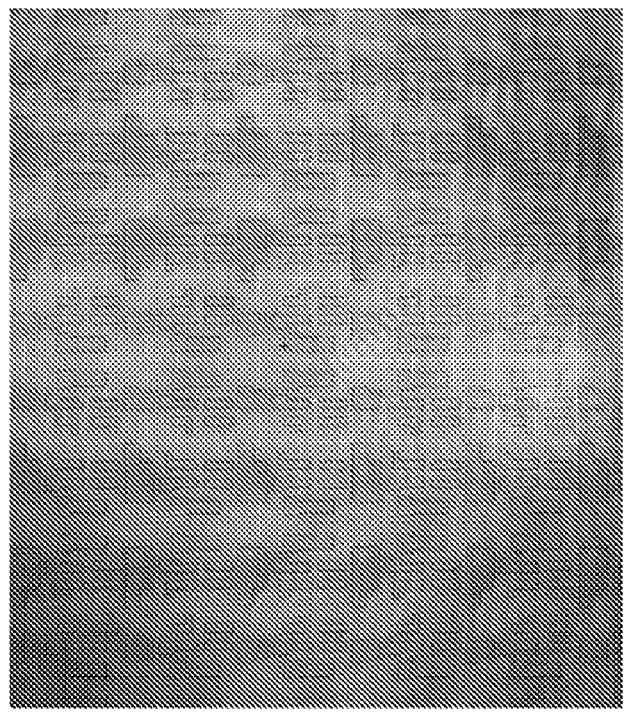
FIG. 9 is an image of an overlay of a chip design layout on the confocal reflection image of FIG. 8, in accordance with embodiments of the present invention.

Step 67 obtains a third composite image, namely an overlay of the chip design layout on the confocal reflection image of FIG. 8 with the stop 34 having been used, as shown in the image of FIG. 9 in accordance with embodiments of the present invention. The chip design layout may be obtained from a database in which the chip design layout has been stored. The chip design layout in FIG. 9 is a layout of the device structure in the substrate 21. The closed contours in FIG. 9 enclose semiconductor material (e.g., silicon) and represent device structure such as sources, drains, gates, etc. The background surrounding the closed contours in FIG. 9 comprises insulative material such as material used in shallow trench isolation. Since the stop 34 was used, the confocal reflection image on which the chip design layout was overlayed to form the third composite image is a high-quality, relatively clean image that can be beneficially used to improve lateral localization of the fault.

Step 68 registers the fault laterally to the chip design layout in dependence on the determination in step 66 of whether the fault is in the substrate 21 or in the dielectric interconnect 22.

If step 66 determines that the fault is in the substrate 21, then step 68 combines the data of FIGS. 8 and 9 to register the fault associated with the spot 82 laterally to the chip design layout through the commonality of the same confocal reflection image on which the overlays of FIGS. 8 and 9 are placed.

If step 66 determines that the fault is in the dielectric interconnect 22, then step 68 performs a first substep and a second substep. The first substep combines the data of FIGS. 7 and 8 to register the fault associated with the spot 81 of FIG. 7 to the confocal reflection image of FIG. 8, which modifies FIG. 8 to show the associated with the spot fault 82 on the confocal reflection image. After the first substep is performed, the second substep combines the data of the modified FIG. 8 and the data of FIG. 9 to register the fault associated with the spot 82 laterally to the chip design layout through the commonality of the same confocal reflection image for FIGS. 8 and 9. For this embodiment in which the fault is determined in step 66 to be in the dielectric interconnect 22, the chip design layout overlay in FIG. 9 further includes a layout of dielectric interconnect structure in the dielectric interconnect 22, said dielectric interconnect structure including metals and vias in the dielectric interconnect 22.

The preceding result of step 68 of where the fault exists laterally with respect to the chip design layout may be recorded any known output form such as, inter alia, printed output from the computer system 40, stored output in a memory device of the computer system 40, display output on a display device of the computer system 40, etc. In one embodiment the displayed output displays the fault visually on the chip design layout.

Step 69 improves the longitudinal resolution of the fault for the embodiment in which the fault is determined in step 66 to be in the dielectric interconnect 22. Step 69 makes use of the fact that the decay length L in Equation (1) varies with the angle θ that a light ray in the substrate 21 makes with the optic axis 50 depicted in FIG. 3. Thus the amplitude of the light wave has a variation with depth Z from the interface 29 (see FIG. 3) such that the variation of wave amplitude with Z is a function of θ. Thus, step 69 determines a local range of longitudinal positions in the dielectric interconnect 22 such that the fault is located within the local range, wherein a length of the local range in the longitudinal direction 4 is less than a total length of the dielectric interconnect 22 in the longitudinal direction 4.

The preceding result of step 69 of the local range of longitudinal positions in the dielectric interconnect 22 determined to include the fault may be recorded any known output form such as, inter alia, printed output from the computer system 40, stored output in a memory device of the computer system 40, display output on a display device of the computer system 40, etc.

Figure 10:
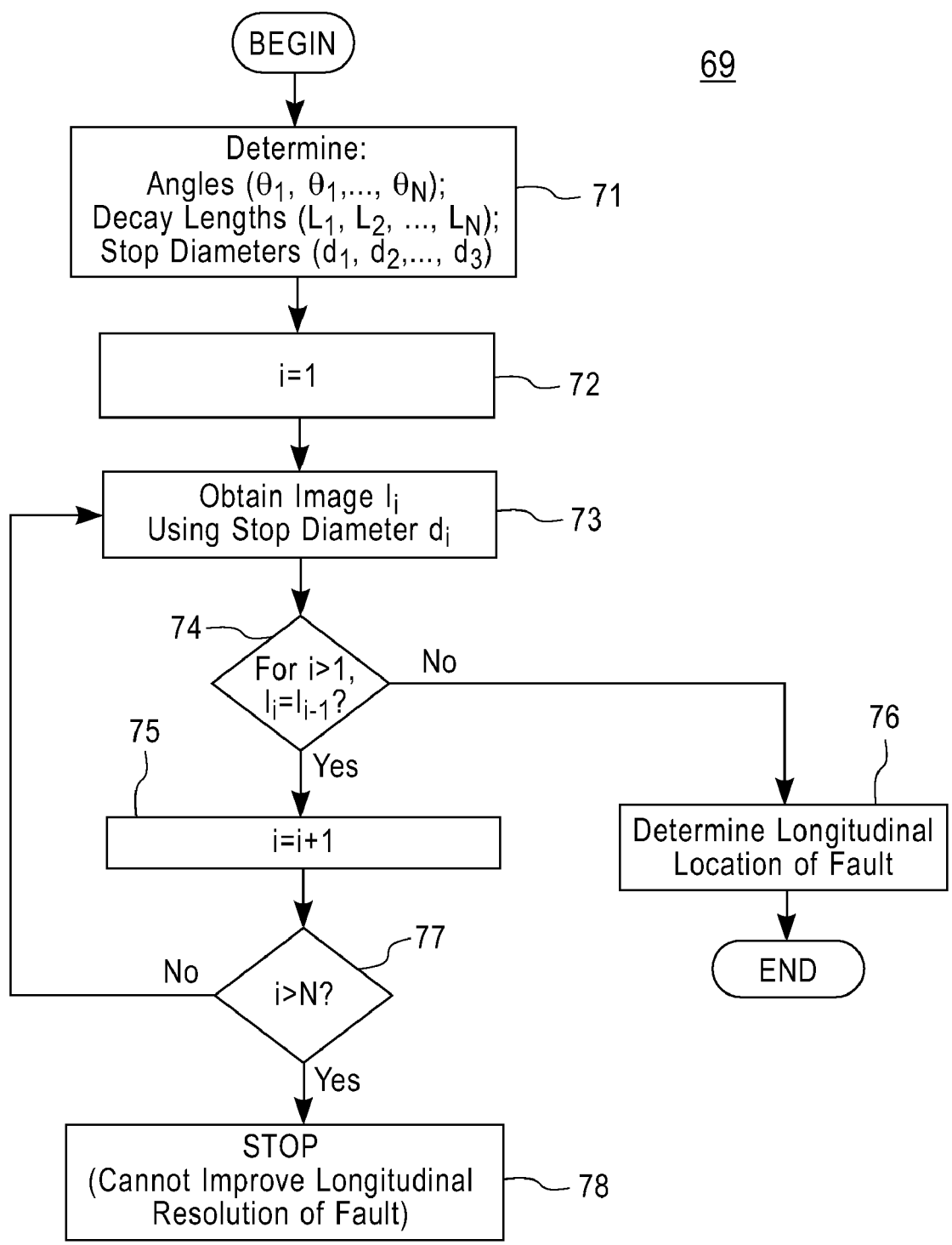
FIG. 10 is a flow chart for implementing a step in the flow chart of FIG. 6 for improving longitudinal resolution of the fault in the dielectric interconnect, in accordance with embodiments of the present invention.

FIG. 10 is a flow chart for implementing step 69 of FIG. 6 for improving longitudinal resolution of the fault in the dielectric interconnect, in accordance with embodiments of the present invention. The method depicted in FIG. 10 comprises steps 71-78.

Noting that the decay length L varies monotonically with θ via Equation (1), $L=1/\{k_0*sqrt((n_{sub})^2-(n_{die})^2)\}$ at θ=90 degrees and L is infinite at θ=θ$_c$. Step 71 determines a monotonically decreasing sequence $\{\theta_1, \theta_2, \ldots, \theta_N\}$ of N values of θ such that: N at least 2, $\theta_1 \leq \theta_a$, $\theta_N > \theta_c$, and $\theta_1 > \theta_2 > \ldots > \theta_N$. Step 71 also determines decay lengths $L_1, L_2, \ldots, L_N$ respectively associated with $\theta_1, \theta_2, \ldots, \theta_N$. In one embodiment, $\theta_1 = \theta_a$. In one embodiment, $\theta_1$ is in a range of 45 to 60 degrees subject to $\theta_1 \leq \theta_a$ (e.g., $\theta_1 = 45$ degrees, $\theta_1 = 50$ degrees, $\theta_1 = 55$ degrees, $\theta_1 = 60$ degrees, etc.).

In one embodiment, the angles $\theta_1, \theta_2, \ldots, \theta_N$ for N>2 are initially selected, after which $L_1, L_2, \ldots, L_N$ are determined via Equation (1). Then corresponding values of Z (see FIG. 3) are determined via: $Z_1=L_1, Z_2=L_2, \ldots, Z_N=L_N$. For example, the angles $\theta_1, \theta_2, \ldots, \theta_N$ for N>2 may be initially chosen to be uniformly distributed such that $\theta_{i+1}-\theta_i=(\theta_N-\theta_1)/(N-1)$ for i=1, 2, ..., N-1.

In one embodiment, the decay lengths $L_1, L_2, \ldots, L_N$ are determined as follows. Let the dielectric interconnect 22 comprise N layers (N at least 2) defined by boundaries $Z=Z_0, Z_1, \ldots, Z_N$ such that layer n is bounded by $Z_{n-1}$ and $Z_n$ for n=1, 2, ..., N, wherein $Z_n$ (n=0, 1, ..., N) denotes distance into the dielectric interconnect from the interface 22, and wherein $Z_0 > Z_1 > \ldots > Z_N$ (see variable Z in FIG. 3). $L_1$, $L_2, \ldots, L_N$ are determined via $L_1 = Z_1, L_2 = Z_2, \ldots, L_N = Z_N$, after which $\theta_1, \theta_2, \ldots, \theta_N$ are determined by solving Equation (1) for θ as representing $\theta_i$ via substitution of $L_i$ for L in Equation (1) for i=1, 2, ..., N.

Also in step 71, the stop diameters $d_1, d_2, \ldots, d_N$ corresponding respectively to $\theta_1, \theta_2, \ldots, \theta_0 N$ are determined: from Equations (2)-(3) (in consideration of the dependence of L on θ via Equation (1)) if the stop 34 is positioned longitudinally as shown in FIG. 4; or from the discussion supra of determining d with respect to FIG. 5 if the stop 34 is positioned longitudinally as shown in FIG. 5. Note that $d_1 > d_2 > \ldots > d_N$.

Step 72 sets the index i to 1 to initialize a loop, wherein each iteration i of the loop executes steps 73-77 for processing the angle $\theta_i$. The loop is performed over i=1, 2, ..., N.

Step 73 obtains an image $I_i$ using stop diameter $d_i$. The image $I_i$ is similar to the image of FIG. 8 and the image $I_i$ is an overlay of a possible electrical response image of the fault on a confocal reflection image with the stop diameter $d_i$ having been used.

Step 74 is performed if i>1; otherwise step 75 is next performed. If i>1, step 74 determines whether image $I_i$ is essentially the same image as image $I_{i-1}$ (i.e., whether image $I_i$ has essentially the same electrical response as the electrical response (or lack thereof) appearing in the image $I_{i-1}$. If step 74 determines that image $I_i$ has essentially the same image as image $I_{i-1}$ (i.e., whether image $I_i$ has essentially the same electrical response as the electrical response, or lack thereof, appearing in the image $I_{i-1}$ as denoted by $I_i = I_{i-1}$) then step 75 is next executed; otherwise step 76 determines that a fault exists longitudinally between about $Z = Z_i$ and about $Z = Z_{i-1}$ which ends the process of FIG. 10.

Thus step 76 exits the loop after iteration j has been performed after having determined that in iterations i of the loop, $I_i$ is essentially a same electrical image as $I_{i-1}$ for i=1, 2, ..., j−1 and after having determined that in iteration j of the loop, $I_j$ is essentially not the same electrical image as $I_{j-1}$, wherein j is equal to 2, 3, ..., or N. Step 76 may record that a local range in the dielectric substrate 22 in which the fault is located is from a distance $L_{j-1}$ to a distance $L_j$ in the dielectric substrate measured from the interface 29. The local range may be recorded in step 76 in any known output form such as, inter alia, printed output from the computer system 40, stored output in a memory device of the computer system 40, display output on a display device of the computer system 40, etc.

Step 75 increments i by 1.

Step 77 determines whether i>N. If step 77 determines that i>N then the process of FIG. 10 ends in step 78 without improving the resolution of the fault longitudinally in the dielectric substrate 22; otherwise the process loops back to step 73 for execution the next iteration of the loop.

If further longitudinal localization of the fault is desired, the preceding process of FIG. 10 of obtaining and analyzing images similar to the image of FIG. 8 may be repeated for one or more angles between $\theta = \theta_i$ and $\theta = \theta_{i-1}$ to determine a smaller range of Z than the range of $Z_i$ to $Z_{i-1}$.

Figure 11:
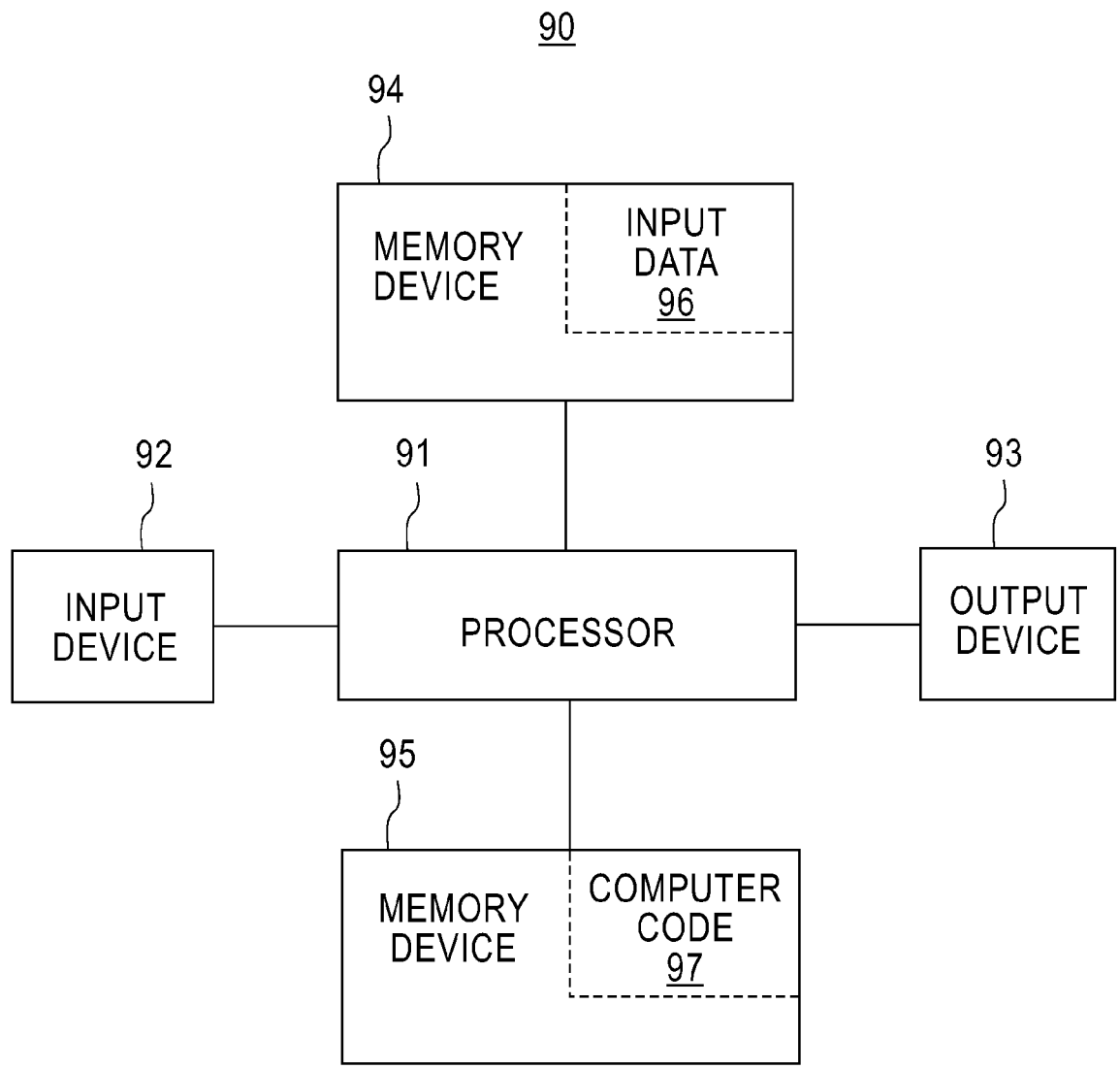
FIG. 11 illustrates a computer system for use in improving lateral and longitudinal spatial resolution in optical diagnostics of faults in integrated circuits, in accordance with embodiments of the present invention.

FIG. 11 illustrates a computer system 90 for use in improving lateral and longitudinal spatial resolution in optical diagnostics of faults in integrated circuits, in accordance with embodiments of the present invention. The computer system 90 is an embodiment of the computer system 40 in FIG. 1. The computer system 90 comprises a processor 91, an input device 92 coupled to the processor 91, an output device 93 coupled to the processor 91, and memory devices 94 and 95 each coupled to the processor 91. The input device 92 may be, inter alia, a keyboard, a mouse, etc. The output device 93 may be, inter alia, a printer, a plotter, a computer screen, a magnetic tape, a removable hard disk, a floppy disk, etc. The memory devices 94 and 95 may be, inter alia, a hard disk, a floppy disk, a magnetic tape, an optical storage such as a compact disc (CD) or a digital video disc (DVD), a dynamic random access memory (DRAM), a read-only memory (ROM), etc. The memory device 95 includes a computer code 97 which is a computer program that comprises computer-executable instructions. The computer code 97 includes an algorithm for performing any of the processes described supra as being performed by the computer system 40 of FIG. 1. The processor 91 executes the computer code 97. The memory device 94 includes input data 96. The input data 96 includes input required by the computer code 97. The output device 93 displays output from the computer code 97. Either or both memory devices 94 and 95 (or one or more additional memory devices not shown in FIG. 11) may be used as a computer usable storage medium (or program storage device) having a computer readable program embodied therein and/or having other data stored therein, wherein the computer readable program comprises the computer code 97. Generally, a computer program product (or, alternatively, an article of manufacture) of the computer system 90 may comprise said computer usable storage medium (or said program storage device).

While FIG. 11 shows the computer system 90 as a particular configuration of hardware and software, any configuration of hardware and software, as would be known to a person of ordinary skill in the art, may be utilized for the purposes stated supra in conjunction with the particular computer system 90 of FIG. 11. For example, the memory devices 94 and 95 may be portions of a single memory device rather than separate memory devices.

Thus, tailoring the angular spectrum in SIL/NAIL microscopy in accordance with the present invention enhances the information gathered from optical excitation microscopy by improving longitudinal localization of the electrical response, as well as increasing the accuracy of lateral registration to the circuit design layout. Benefits from angular spectrum tailoring are also anticipated in other optical diagnostics methods, such as a significant reduction in noise due to longitudinal vibration in the scattering microscopy technique termed laser voltage probing, with annular illumination.

What is claimed is:

1. A method for locating a fault in a semiconductor chip, said method comprising:
   providing the semiconductor chip, wherein the semiconductor chip comprises a substrate and a dielectric interconnect in direct mechanical with each other at an interface, wherein the substrate comprises semiconductor circuit elements, and wherein an index of refraction of the dielectric interconnect ($n_{die}$) is less than an index of refraction of the substrate ($n_{sub}$) with respect to monochromatic light characterized by a free-space wavelength $\lambda_0$;
   providing a SIL/NAIL denoting a solid immersion lens (SIL) or a numerical aperture increasing lens (NAIL), wherein an index of refraction of the SIL/NAIL with respect to the monochromatic light is about equal to the index of refraction of the substrate ($n_{sub}$);
   determining a lateral location of the fault in the semiconductor chip in a lateral direction parallel to the interface;
   positioning the SIL/NAIL on the chip such that a planar surface of the SIL/NAIL is parallel to and in direct mechanical contact with an external surface of the substrate;

directing the monochromatic light in a first optical path from an optical microscope through the SIL/NAIL and then into the substrate at angles (θ) equal to and greater than zero degrees with respect to a longitudinal direction that is perpendicular to the lateral direction and then into the dielectric interconnect by refraction at the interface, wherein the first optical path comprises the determined lateral location of the fault, and wherein the optical microscope comprises an objective lens;

obtaining a first reflection image and a first electrical response image of a portion of the chip with respect to the monochromatic light in the first optical path and overlaying the first electrical response image on the first reflection image to form a first composite image, wherein a spot on the overlayed first electrical response image identifies the fault;

directing the monochromatic light in a second optical path from the optical microscope through the SIL/NAIL and then into the substrate, wherein an optical stop in the second optical path is opaque to the monochromatic light and comprises a sufficiently large size to prevent all subcritical angular components of the monochromatic light from being incident on the SIL/NAIL, wherein the subcritical angular components are subcritical with respect to a critical angle for total internal reflection at the interface, and wherein the second optical path comprises the determined lateral location of the fault;

obtaining a second reflection image and a second electrical response image of the portion of the chip with respect to the monochromatic light in the second optical path and overlaying the second electrical response image on the second reflection image to form a second composite image;

ascertaining whether the overlayed second electrical response image comprises the spot;

if said ascertaining ascertains that the overlayed second electrical response image comprises the spot, then recording that the fault is in the substrate;

if said ascertaining ascertains that the overlayed second electrical response image does not comprise the spot, then recording that the fault is in the dielectric interconnect.

2. The method of claim 1, wherein the objective lens is disposed between the stop and the SIL/NAIL.

3. The method of claim 1, wherein the stop is disposed between the objective lens and the SIL/NAIL.

4. The method of claim 3, wherein the stop is about touching an outer surface of the SIL/NAIL.

5. The method of claim 1, wherein the optical microscope is a confocal laser scanning microscope.

6. The method of claim 1, wherein said ascertaining ascertains that the overlayed second electrical response image comprises the spot.

7. The method of claim 6, wherein the method further comprises after said ascertaining ascertains that the overlayed second electrical response image comprises the spot:

overlaying a chip design layout on the second reflection image to form a third composite image; and combining the second composite image and the third composite image to register the fault to the chip design layout.

8. The method of claim 1, wherein said ascertaining ascertains that the overlayed second electrical response image does not comprise the spot.

9. The method of claim 8, wherein the method further comprises after said ascertaining ascertains that the overlayed second electrical response image does not comprise the spot:

determining a local range of longitudinal positions in the dielectric interconnect such that the fault is located within the local range, wherein a length of the local range in the longitudinal direction is less than a total length of the dielectric interconnect in the longitudinal direction.

10. The method of claim 9, wherein the stop has a circular shape characterized by a stop diameter (d), and wherein said determining the local range of longitudinal positions in the dielectric interconnect comprises:

determining values $\theta_1, \theta_2, \ldots, \theta_N$ of angle θ of the monochromatic light in the substrate such that, wherein N is at least 2, wherein $\theta_1 > \theta_2 > \ldots > \theta_N$, $\theta_1 \leq \theta_a$, and $\theta_N > \theta_c$, and wherein $\theta_a$ is an angular semi-aperture of the optical microscope;

determining decay lengths $L_1, L_2, \ldots, L_N$ respectively associated with $\theta_1, \theta_2, \ldots, \theta_N$, wherein each decay length characterizes evanescent decay in the dielectric interconnect of said all supercritical angular components of totally reflected monochromatic light at the interface;

determining stop diameters $d_1, d_2, \ldots, d_N$ corresponding respectively to $\theta_1, \theta_2, \ldots, \theta_N$, wherein $d_1 > d_2 > \ldots > d_N$, and wherein each stop diameter is sufficiently large to facilitate the stop comprising said sufficiently large size;

performing a loop from i=1 to i=N, wherein iteration i of the loop comprises: performing said directing the monochromatic light in the second optical path at angle $\theta_i$ using stop diameter $d_i$ and said obtaining the second electrical response image $I_i$, and if i>1 then determining if $I_i$ is essentially a same electrical response image as $I_{i-1}$; and during said performing the loop, exiting the loop after iteration j has been performed after having determined in iteration i of the loop that $I_i$ is essentially a same electrical response image as $I_{i-1}$ for i=1, 2, and j−1 and after having determined in iteration j of the loop that $I_j$ is essentially not a same electrical response image as $I_{j-1}$, wherein j is equal to 2, 3, ..., or N; and recording that the local range in which the fault is located is from a distance $L_{j-1}$ to a distance $L_j$ in the dielectric substrate measured from the interface.

11. The method of claim 10, wherein the SIL/Nail is a central SIL/NAIL or an aplanatic SIL/NAIL;

wherein if the SIL/Nail is said central SIL/NAIL then said determining the stop diameter $d_i$(i=1, 2, ..., N) comprises determining $d_i$ from the formula of:

$$d_i = 2*h*\tan(\arcsin(\sqrt{(n_{die})^2 + (L_i*k_0)^{-2}}/n_{sub}));$$

wherein if the SIL/Nail is said aplanatic SIL/NAIL then said determining the stop diameter $d_i$ comprises determining $d_i$ from the formula of:

$$d_i = 2*h*\tan(\arcsin(\sqrt{(n_{die})^2 + (L_i*k_0)^{-2}}/(n_{sub})^2));$$

wherein $L_i = 1/\{k_0*\sqrt{(n_{sub}*\sin\theta_i)^2 - (n_{die})^2}\}$;

wherein h denotes a height of the stop above the external surface of the substrate in a direction toward the optical microscope from the external surface;

wherein $k_0 = 2\pi/\lambda_0$.

12. The method of claim 10, wherein the dielectric interconnect comprises N layers defined by boundaries $Z=Z_0, Z_1, \ldots, Z_N$ such that layer n is bounded by $Z_{n-1}$ and $Z_n$ for n=1, 2, ..., N, wherein $Z_n$ (n=0, 1, ..., N) denotes distance into the dielectric interconnect from the interface, wherein $Z_0 > Z_1 > \ldots > Z_N$, wherein said determining $L_1, L_2, \ldots, L_N$ comprises setting $L_1 = Z_1, L_2 = Z_2, \ldots,$ and $L_N = Z_N$, and wherein said determining $\theta_1, \theta_2, \ldots, \theta_N$ comprises solving particular equations for $\theta_i$ for $i=1, 2, \ldots, N$, wherein said particular equations are:

$$L_i = 1/\{k_0 * \text{sqrt}((n_{sub} * \sin \theta_i)^2 - (n_{die})^2)\} \text{ for } i=1, 2, \ldots, N.$$

13. The method of claim 10, wherein $\theta_1$ is in a range of 45 to 60 degrees.

14. The method of claim 10, wherein $\theta_1 = \theta_a$.

* * * * *